US006934309B2

(12) United States Patent
Nishikawa et al.

(10) Patent No.: US 6,934,309 B2
(45) Date of Patent: Aug. 23, 2005

(54) TWO-DIMENSIONAL LASER DIODE ARRAY LIGHT-EMITTING DEVICE

(75) Inventors: Yuji Nishikawa, Yamanashi (JP); Hiroshi Takigawa, Isehara (JP); Tetsuro Sakano, Kawasaki (JP); Koji Hayano, Yamanashi (JP); Akinori Ohyama, Yamanashi (JP)

(73) Assignee: Fanuc Ltd., Yamanashi (JP)

( * ) Notice: Subject to any disclaimer, the term of this patent is extended or adjusted under 35 U.S.C. 154(b) by 274 days.

(21) Appl. No.: 10/216,324

(22) Filed: Aug. 12, 2002

(65) Prior Publication Data

US 2003/0039278 A1 Feb. 27, 2003

(30) Foreign Application Priority Data

Aug. 21, 2001 (JP) ........................................ 2001-250314

(51) Int. Cl.$^7$ .................................................. H01S 3/04
(52) U.S. Cl. .......................................... 372/36; 372/34
(58) Field of Search ...................................... 372/36, 34

(56) References Cited

U.S. PATENT DOCUMENTS 4,716,568 A * 12/1987 Scifres et al. .................. 372/36
6,274,391 B1 * 8/2001 Wachtler et al. ............... 438/6

OTHER PUBLICATIONS

G.L. Harnagel, et al., "Large Laser Diode Arrays for High–Duty–Cycle Operation", Electronic Letters, Aug. 27, 1992, vol. 28, No. 18, pp. 1702–1704.

Mark A. Neifeld, et al., "Electrical Packaging Impact on Source Components in Optical Interconnects", IEEE Transactions on Components, Packaging, and Manufacturing Technology—Part B, vol. 18, No. 3, Aug. 1995, pp. 578–595.

John G. Endriz, et al., "High Power Diode Laser Arrays", 8106 IEEE Journal of Quantum Electronics, Apr. 28, 1992, vol. 28, No. 4, pp. 952–965.

* cited by examiner

*Primary Examiner*—Paul Ip
*Assistant Examiner*—James Menefee
(74) *Attorney, Agent, or Firm*—Staas & Halsey LLP

(57) ABSTRACT

A two-dimensional LD (laser diode) array light-emitting device constituted by stacking light-emitting units each having a LD bar and a cooling assembly for cooling the LD bar with a simplified electrical connection structure to reduce manufacturing cost. The cooling assembly is electrically connected with one electrode of the LD bar through the die spacer so that a part of the cooling assembly serves as one electrode of the light-emitting unit. The other electrode of the LD bar is electrically connected with a webbed extending section of a conductive layer of a TAB (tape-automated bonding) sheet so that the conductive layer serves as the other electrode of the light-emitting unit. A space between the adjacent cooling assemblies for arranging the LD bar is adjusted by the spacer sheet intervened between the TAB sheet and the cooling assembly.

23 Claims, 5 Drawing Sheets

TWO-DIMENSIONAL LASER DIODE ARRAY LIGHT-EMITTING DEVICE

BACKGROUND OF THE INVENTION

1. Field of the Invention

The present invention relates to a two-dimensional light-emitting device using LD (laser diode) arrays, and in particular to a two-dimensional LD array light-emitting device constituted by stacking a plurality of planar light-emitting units each having a LD bar and a cooling assembly for cooling the LD bar.

2. Description of Related Art

In recent years, a surface light-emitting device using semiconductor laser diodes is drawing attention for use as a pumping light source in a solid-state laser generator such as YAG laser because of a high pumping efficiency. The light source device using LD is advantages in its reduced size and long life in comparison with a conventional discharge lamp such as a xenon lamp.

In constituting a surface light-emitting device using the laser diodes, one-dimensional LD arrays having light-emitting regions aligned linearly are used. The one-dimensional LD array is generally called as "LD bar" since it has a shape of a bar. The LD bars are arranged to form the two-dimensional LD array light-emitting device (surface light-emitting device).

The laser diodes in the LD bar generate considerable heat when driven to raise temperature of the LD bar. Particularly in a case of arranging adjacent LD bars close to each other so as to reduce a dead space (non-emitting region) between light-emitting regions of the LD bars in the surface light-emitting device, there arises a significant problem of how to effectively remove the heat generated by the LD bars. For example, when the two-dimensional LD array is used as a pumping light source of the high-power solid-state laser, an average output power of the surface light-emitting device is 100–200 W/cm$^2$ as a surface light-emitting device with generating heat of 200–400 W/cm$^2$.

In order to absorb the large amount of heat from the LD bars to suppress rising of temperature thereof, it is adopted a structure in which the LD bar is mounted on a planar cooling assembly to be thermally connected therewith. The planar cooling assemblies with the LD bars mounted thereon are stacked to form the surface light-emitting device. A partial cross section of such surface light-emitting device is shown in FIG. 5.

As shown in FIG. 5, the surface light-emitting device comprises a large number, e.g., several hundreds of light-emitting units, of which (n−1)th, n-th, (n+1)th three adjacent light-emitting units Rn−1, Rn and Rn+1 (n: integer not less than two) are shown in FIG. 5.

The n-th light-emitting unit Rn will be described as a representative of the plurality of light-emitting units. A cooling assembly 10 of the light-emitting unit Rn has a laminated structure constituted by three metal plates 11, 12 and 13. An exploded view of the cooling assembly 10 is shown as FIG. 4. Openings 16 and 17 are formed in the metal plates 11, 12 and 13 to form passages for supplying/discharging coolant to/from the cooling assembly 10.

In this example, the opening 16 is used for a passage for supplying the coolant into flow paths 15 in the cooling assembly and the opening 17 is used for discharging the coolant from the flow paths 15. The coolant flows from the opening 16 to the opening 17 through flow paths 15 formed by grooves and openings of the metal plates 11–13.

The path 15a is positioned immediately under the LD bar 56 arranged on the cooling assembly 10. O-rings and rubber sheets (not shown) are provided between the adjacent cooling assemblies 10 for sealing peripheries of the openings 16 and 17 to prevent leakage of the coolant.

The LD bar 56 is mounted on an electrically-conductive die spacer 55 fixed on the metal plate 13 in the vicinity of a peripheral side thereof such that one electrode (e.g., a positive electrode) of the LD bar 56 is electrically connected with the die spacer 55. The other electrode (e.g., a negative electrode) of the LD bar 56 is connected with one end of a bonding wire 53 such as a gold wire. A bonding portion of the wire 53 with the LD bar 56 is indicated by a reference numeral 54.

An insulating sheet 51 is arranged on the metal plate 13 with a predetermined space formed between the insulating sheet 51 and the die spacer 55, and an electrically-conductive connection board 52 is arranged on the insulating sheet 51. The other end of the bonding wire 53 is connected with the connection board 52 at a position not so remote from the LD bar 56. A protrusion 52a of the connection board 52 is electrically connected with a metal plate 11 of a cooling assembly 10 of the adjacent cooling assembly Rn+1. In the similar manner, the metal plate 11 of the cooling assembly Rn is electrically connected with a protrusion 52a of the connection board 52 of the other adjacent cooling assembly Rn−1.

Thus, the metal plate 11 of the cooling assembly 10 serves as one electrode (e.g., positive electrode) of the light-emitting unit Rn and the connection board 52 serves as the other electrode (e.g., negative electrode ultimately connected to the ground) of the light-emitting unit Rn. A number of light-emitting units are connected in series such that a driving current flows the respective LD bars in series. The cooling assembly 10 of the first light-emitting unit R1 and the connection board 52 of the final light-emitting unit RN are connected to a positive terminal and a negative terminal, respectively, and vice versa of an electric power source.

Openings respectively corresponding to the openings 16 and 17 of the cooling assemblies 10 are formed on the insulating sheet 51 and the connection board 52 so that continuous passages of the coolant are formed through the stacked cooling assemblies 10. One end or both ends of the passage for providing the coolant and one end or both ends of the passage for discharging the coolant are connected to an inlet and an outlet, respectively, of a circulation pump.

With the stacked structure of the surface light-emitting device, a manufacturing cost of the surface light-emitting device is reduced. The cost of the parts such as bonding parts and assemble cost, and cost for assembling the cooling assemblies to be stacked to form a surface light-emitting device are relatively increased by a ratio thereof in the whole manufacturing cost of the surface light-emitting device. Thus, it has been strongly desired to improve the structure of the surface light-emitting device to enable a cost reduction thereof.

Reviewing the conventional structure in the above view, there is a problem in that the gold wire has to be arranged from the other electrode of the LD bar to the connection board 52 which is insulated from the cooling assembly 10. Thus, the insulating sheet 51, the connection board 52 and the bonding wire 53 are necessary as essential parts for conducting the other electrode of the LD bar with the metal plate 11 of the adjacent light-emitting unit. Since a large number, e.g., several hundreds, of light-emitting units are stacked for forming the surface light-emitting device, cost of the necessary parts and assembling operation thereof increases in dependence of the number of parts.

Further, the above structure of the light-emitting device requires special structure and special parts such as the gold wire to raise the manufacturing cost. If mass-produced parts are used in attempt to reduce the cost of the parts, there arises a problem of restriction of disabling thickness of the surface light-emitting device.

SUMMARY OF THE INVENTION

An object to the present invention is to provide a two-dimensional LD array light-emitting device constituted by stacked light-emitting units having a simplified electrical connection structure to reduce manufacturing cost.

A two-dimensional light-emitting device of the present invention comprises a plurality of stacked light-emitting units. Each of the plurality of light-emitting units has a cooling assembly and a laser diode bar arranged on the cooling assembly to be thermally and electrically connected with the laser diode bar. At least a part of said cooling assembly serving as a first electrode of each light-emitting unit. Each of said plurality of light-emitting unit further has a tape-automated-bonding sheet including an electrically conductive layer and an insulating layer and arranged between adjacent ones of the cooling assemblies such that the insulating layer confronts a surface of the cooling assembly on which the laser diode bar is arranged. The electrically conductive layer includes a webbed extending section for electrical connection with the laser diode bar and serves as a second electrode of each light-emitting unit. The first electrode and the second electrode are electrically isolated from each other by the insulating layer.

The cooling assembly may have openings to form passages for introducing and discharging coolant and coolant paths communicating with the passages. The tape-automated-bonding sheet may have openings corresponding to the openings formed in the cooling assembly.

Each of the light-emitting units may further have a spacer plate for adjusting a space between adjacent ones of the cooling assemblies. The spacer plate may be arranged between the tape-automated-bonding sheet and the surface of the cooling assembly of each light-emitting unit. In this case, it is preferable that the spacer plates is constituted by a member which presents adhesion by heat.

The spacer plates may be arranged between the tape-automated-bonding sheet of each light-emitting unit and the cooling assembly of the light-emitting unit adjacent to each light-emitting unit. In this case, the spacer plate is made of electrically conductive material, such as copper, and alloy containing copper and tungsten. Alternatively, the spacer plate may be constituted by a member made of insulating material coated by electrically conductive material. At least a surface of the spacer plate confronting the tape-automated-bonding sheet of each light-emitting unit and a surface of the spacer plate confronting the cooling assembly of the light-emitting unit adjacent to each light-emitting unit may be coated by solder.

The tape-automated-bonding sheet may further include a metal plate arranged on the electrically conductive layer. The metal plate may be a copper plate and the copper plate may be coated with solder. Alternatively, the tape-automated-bonding sheet may further includes an insulant plate having an electrically conductive layer formed thereon, which is arranged on the electrically conductive layer of the tape-automated-bonding sheet. A connecting portion of the extending section of the tape-automated-bonding sheet to be electrically connected with the laser diode bar may be coated by solder or gold. Slits may be formed in a vicinity of the connecting portion of the extending section of the tape-automated-bonding sheet.

Outer surfaces of the cooling assemblies may be coated by solder or gold. This is advantageous in making the bonding of the laser diode bar stable. Material of solder may be tin, an alloy of lead and tin or an alloy of silver, tin and copper.

Each of the light-emitting units may further have a die spacer intervened between the laser diode bar and the cooling assembly. It is preferable that the die spacer is made of a material having a coefficient of thermal expansion approximate to a coefficient of thermal expansion of the laser diode bar and a high heat conductivity.

DETAILED DESCRIPTION OF THE PREFERRED EMBODIMENTS

Figure 1:
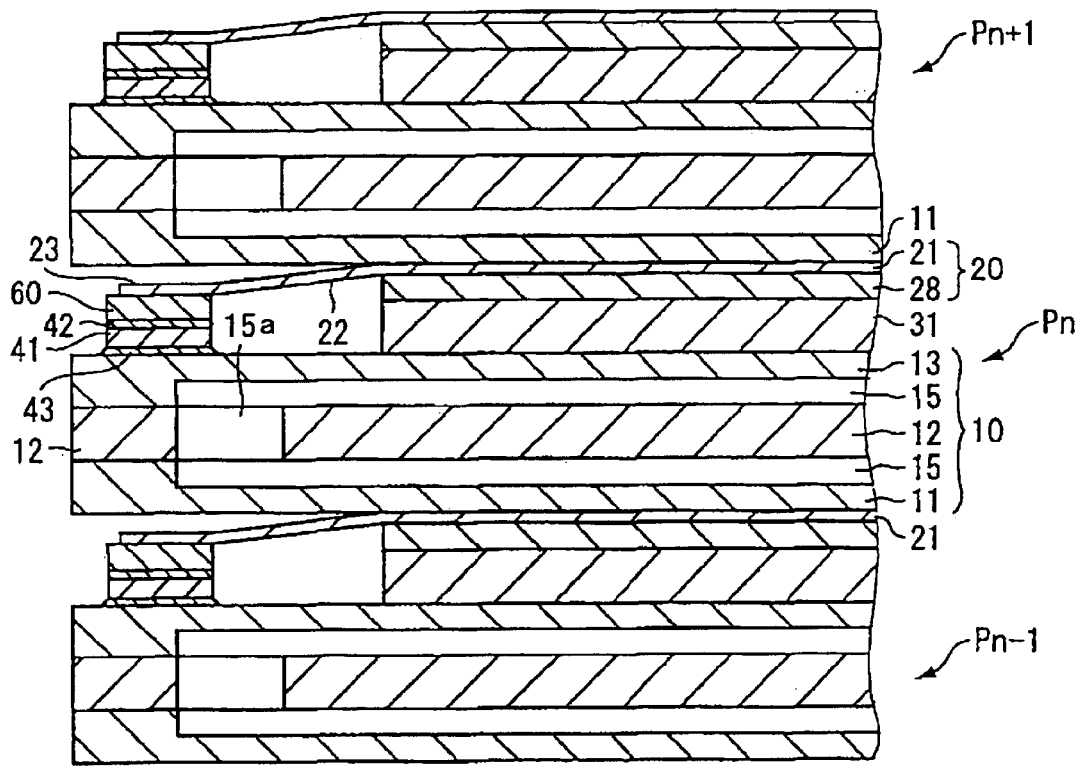
FIG. 1 is a partial vertical cross-section of a surface light-emitting device according to one embodiment of the present invention.

FIG. 1 shows a cross-sectional structure of a two-dimensional LD array surface light-emitting device according to a first embodiment of the present invention. The light-emitting device comprises a large number of light-emitting units stacked successively. In FIG. 1, only three adjacent light-emitting units, an (n−1)th light-emitting unit Pn−1, an n-th light-emitting unit Pn and an (n+1)th light-emitting unit Pn+1 (n: integer not less than two) are depicted in light-emitting units P1–PN of the total number N which constitutes the surface light-emitting device.

Figure 4:
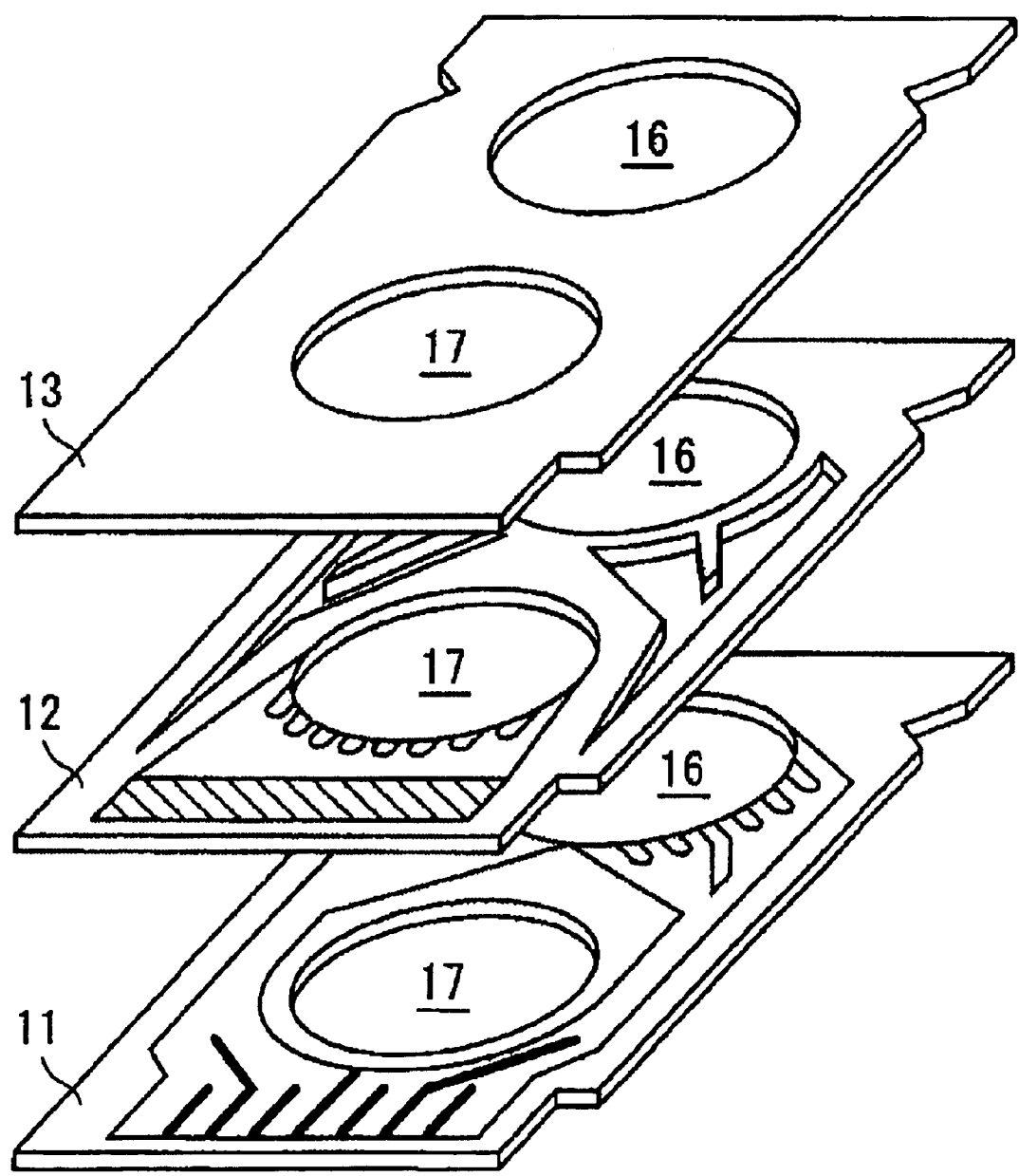
FIG. 4 is an exploded view of a cooling assembly for use in the embodiments of the present invention.

An arrangement and a function of the n-th light-emitting unit Pn will be described as a representative of the plurality of light-emitting units P1–PN. The light-emitting unit Pn comprises a LD bar 60 and a cooling assembly 10 for cooling the LD bar 60 mounted thereon. A cooling assembly having a conventional structure may be adopted as the cooling assembly 10 as shown in an exploded view of FIG. 4. Particularly, the cooling assembly 10 has a laminated structure comprising three metal plates 11–13 joined together. Openings 16 and 17 are formed in the metal plates 11–13 at corresponding positions to from passages for supplying/discharging coolant into/from the cooling assembly 10. In this embodiment, the openings 16 are used for a passage for supplying the coolant and the openings 17 are used for a passage for discharging the coolant. The coolant supplied from the openings 16 flows through coolant paths 15 formed by grooves and through holes in the metal plates 11–13 and discharged from the openings 17.

As shown in FIG. 1, a path 15a is positioned immediately under the LD bar 60 mounted on the cooling assembly 10 to effectively remove heat from the LD bar 60. Sealing member such as O-rings and rubber sheets (not shown) are arranged between the adjacent cooling assemblies 10 for sealing peripheries of the openings 16 and 17 to prevent leakage of the coolant.

The LD bar 60 is mounted on an electrically conductive die spacer 41 fixed on the metal plate 13 by soldering in the vicinity of a peripheral side thereof, so that one electrode (e.g., positive electrode) of the LD bar 60 is electrically connected to the die spacer 41. A solder layer 43 is formed between the metal plate 13 and the die spacer 41, and a solder layer 42 is formed between the die spacer 41 and the LD bar 60 by the soldering.

It is preferable that the die spacer 41 is made of a material having a coefficient of thermal expansion approximate to that of the LD bar 60 and a high heat conductivity, so as to avoid stress on the cooling assembly 10 and the LD bar 60 due to the bonding thereof. Examples of such material of the die spacer 41 are SiC, AlN and diamond which produce little bur and have high planarity and are easy to be machined. Since the above materials are insulant, surfaces of the material has to be metalized. In the case of using conductive material such as CuW, it is not necessary to metalize surfaces thereof. Use of copper is advantageous in cost.

A TAB sheet 20 formed from a TAB (tape automated bonding) tape is used for electrically connecting the other electrode (e.g., negative electrode) of the LD bar 60 with the metal plate 11 of the adjacent light-emitting unit Pn+1.

The TAB tape is known as a mass-produced product in the form of a tape or a strip having structure in which a copper conductive layer is coated by an insulating layer (polyimide resin) with a part of the copper layer remained not coated generally for use in bonding of an IC (integrated circuit) chip. In use of the TAB tape, an exposed part of the copper layer without the polyimide layer is soldered to electrodes of the IC chip.

The TAB tape has been conventionally used for electrical connection with a plurality of terminals of the IC chip corresponding to channels thereof, as an integrated conductive-path member integrally holding multi-channel signal lines. A plurality of conductive paths are formed on the copper conductive layer and the exposed part of the conductive layer is divided into a plurality of lead lines. According to the present invention, the TAB tape is utilized as the TAB sheet 20 for providing a single-channel conductive path for electrically connection with the LD bar by modifying the TAB tape.

The TAB sheet 20 of this embodiment comprises a copper plate 21 arranged on an electrically conductive layer and a polyimide resin layer 28 covering a part of the copper plate 21 for insulation thereof. The TAB sheet 20 may comprise an insulant plate with an electrically conductive layer formed thereon in place of the copper plate 21. As shown in a plan view of FIG. 2, openings 26 and 27 are formed in the TAB sheet 20 at positions to respectively correspond to those of the openings 16 and 17 formed in the cooling assembly 10. The TAB sheet 20 has a reduced-width portion in the vicinity of one end thereof where several slits 24 and 25 are formed. The slits 24 are formed not to extend to the end of the sheet 20 and the slits 25 are formed to extend to the end of the sheet 20. The Slits 24 and 25 are formed for preventing stress on the LD bar 60 due to the bonding so that the extending section 22 does not lose its webbed form.

As shown in FIG. 1, an appropriate region of the reduced-width portion of the TAB sheet 20 forms a webbed extending section 22 of the copper plate 21 not coated with the polyimide resin layer 28. A terminal portion of the extending section 22 of the TAB sheet 20 is used as a connecting portion 23 for bonding with the other electrode of the LD bar 60. The Slits 24 and 25 are formed so that the extending section 22 does not lose its webbed form. It is preferable that a part or the whole of the copper plate 21 including the connecting portion 23 is coated by tin-lead solder. The connecting portion 23 may be further coated by gold in addition to the tin-lead solder so as to secure higher electrical conductivity.

Figure 5:
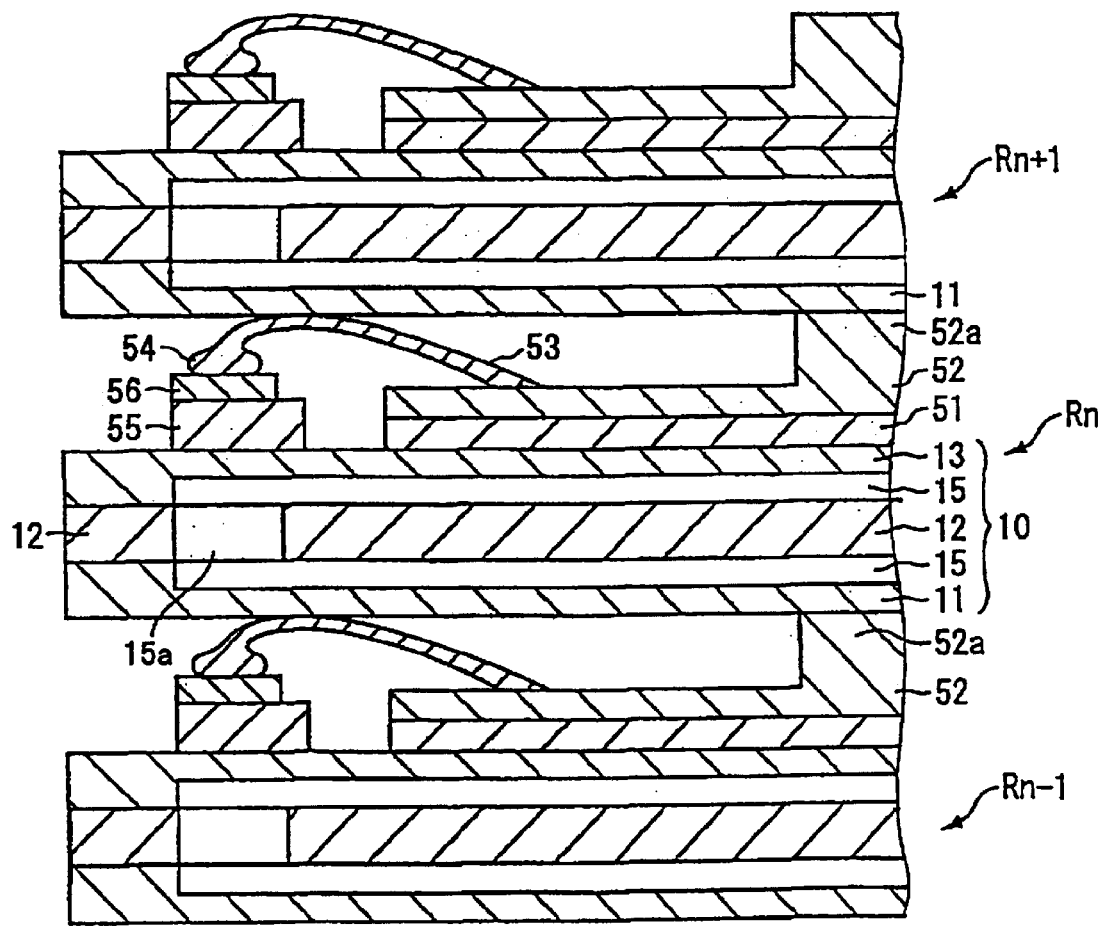
FIG. 5 is a partial vertical cross-section of a surface light-emitting device according to the prior art.

A conductive path having a sectional area larger than the bonding wire is formed by the copper plate 21 of the TAB sheet 20 to realize a low electrical resistance at a relatively low cost. The conventional wiring structure in which the connection board 52, the insulating sheet 51 and the gold wire 53 are used, as shown in FIG. 5, is replaced with the TAB sheet 20 having the webbed extending section 22 to make the whole wiring structure simple and also reduce the manufacturing cost.

Further, the copper plate 21 of the TAB sheet 20 also functions as the connection board 52 of the conventional structure to realize the structure directly electrically connecting the LD bar 60 and the connection board 52 to contribute reduction of electrical resistance of the wiring structure.

Figure 2:
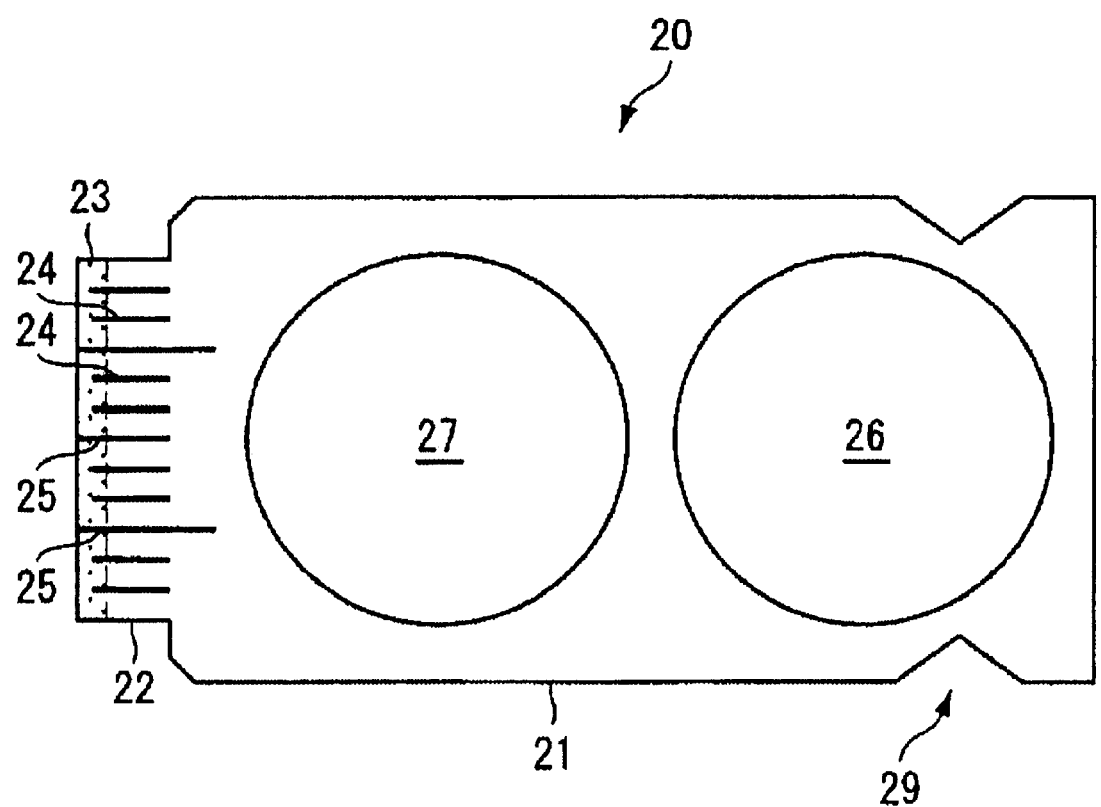
FIG. 2 is a plan view of a tape automated bonding sheet for use in the first embodiment and a second embodiment of the present invention.

A guide or a pin hole may be formed in the cooling assembly 10 for easier positioning in stacking the light-emitting units P1–PN. In this case, a guide 29 as shown in FIG. 2 or a pin hole for positioning may be formed in the TAB sheet 20 to correspond the guide or the pin hole formed in the cooling assembly 10.

Since the TAB tape forming the TAB sheet 20 is a mass-produced product having a standard thickness, the TAB tape has a restriction in selecting the thickness in view of the advantage in its cost.

According to the present invention, a necessary space for arranging the LD bar 60 is secured between the adjacent cooling assemblies by providing a spacer plate.

As shown in FIG. 1, the TAB sheet 20 is arranged such that the polyimide resin layer 28 confronts the metal plate 13 of the cooling assembly 10, and a spacer plate 31 is intervened between the TAB sheet 20 and the metal plate 13. The spacer plate 31 is used for adjusting a level of the TAB sheet 20 to conform to a level of the LD bar 60. The spacer plate 31 may be omitted if it is not necessary to adjust the level of the TAB sheet 20. The level adjustment is carried out such that an appropriate space is formed between the connection portion 23 of the TAB sheet 20 positioned on the LD bar 60 and the metal plate 11 of the cooling assembly of the adjacent light-emitting unit Pn+1 to prevent the connection portion 23 from being in contact with the metal plate 11 not to exert an external force on the LD bar 60, when the light-emitting units P1–PN are stacked.

In both cases of using and not using the spacer plate 31, the copper plate 21 of the TAB sheet 20 is electrically isolated from the cooling assembly 10 of the light-emitting unit Pn by the polyimide resin layer 28 of the TAB sheet 20 positioned therebetween, and therefore the insulating sheet 51 used in the conventional structure as shown in FIG. 5 is made unnecessary. The spacer plate 31 may be either electrically conductive or not electrically conductive and it is preferably that the spacer plate 31 presents adhesion with heat so as to obtain stable fixing state of the spacer plate 31 without any special fixing means. For example, a metal plate coated with a solder layer having an appropriate melting point to present the adhesion with heat is preferably used as the spacer plate 31.

The outer surface of the copper plate 21 opposite to a surface coated by the ployimide resin layer 28 is in contact and electrically connected with the metal plate 11 of the cooling assembly 10 of the adjacent light-emitting unit Pn+1. For securing better electric conductivity, a part or the whole of the surface of the metal plate 11 and 13 of the cooling assembly 10 may be coated with solder.

Thus, at least a part of the cooling assembly 10 serves as one electrode (e.g., a positive electrode) of the light-emitting unit Pn, and the copper plate 21 of the TAB tape 20 serves as the other electrode (e.g., a negative electrode to be connected to earth) of the light-emitting unit Pn. The plurality of light-emitting units P1–PN are successively stacked to form the light-emitting device so that the LD bars 60 of the light-emitting units P1–PN are electrically connected in series to be driven by the driving current.

One terminal (e.g., positive terminal) of a power source is connected to the cooling assembly 10 of the light-emitting unit P1 at one end of the light-emitting device and the other terminal (e.g., negative terminal) of the power source is connected to the copper plate 21 of the light-emitting device PN at the other end of the light-emitting device.

Openings respectively corresponding to the openings 16 and 17 formed in the metal plates 11–13 of the cooling assembly 10 are formed the spacer plate 31, so that the passages of the coolant are formed through the stacked light-emitting units P1–PN. One end or both ends of each passage is connected to an inlet or an outlet of a circular pump of coolant.

In the foregoing first embodiment, the TAB sheet 20 is arranged such that the polyimide resin layer 28 thereof confronts the cooling assembly 10 of the light-emitting unit Pn and the spacer plate 31 is intervened between the TAB sheet 20 and the cooling assembly 10 of the light-emitting unit Pn. Alternatively, the spacer plate 31 may be arranged between the TAB sheet 20 and the cooling assembly 10 of the adjacent light-emitting unit Pn+1. Such arrangement is shown in FIG. 3 as a second embodiment.

Figure 3:
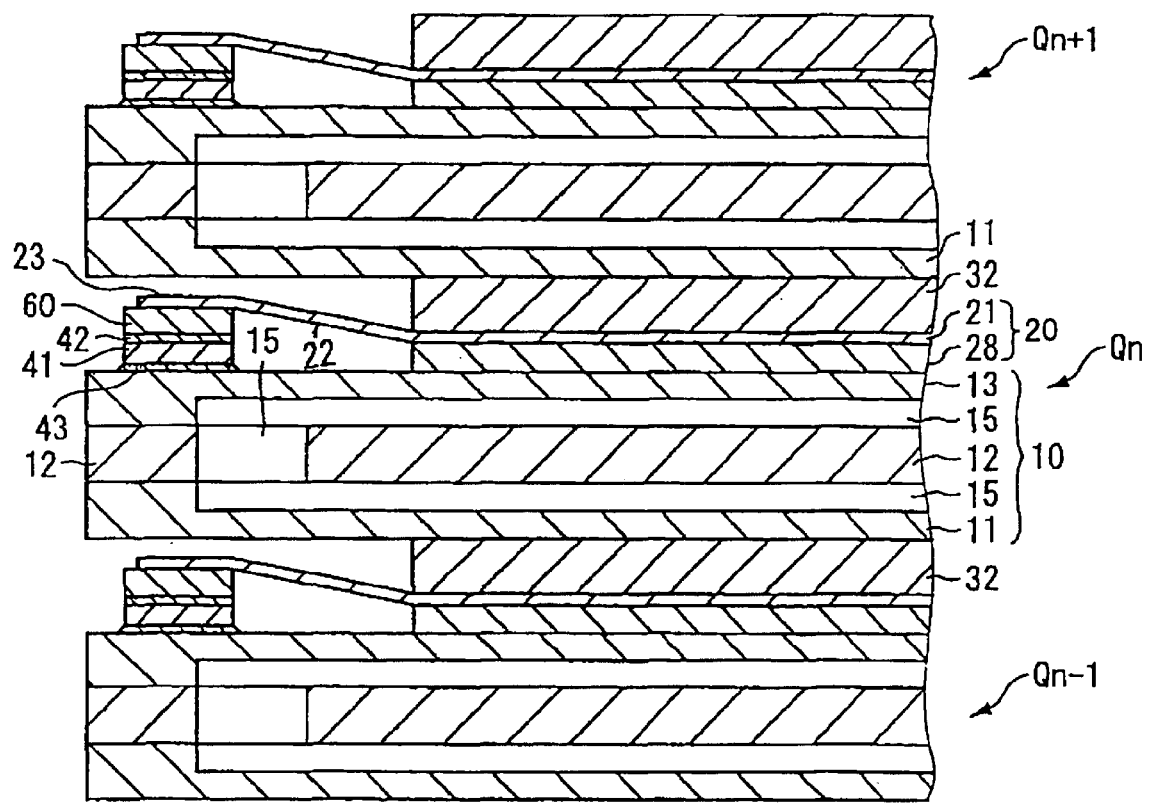
FIG. 3 is a partial vertical cross-section of a surface light-emitting device according to a second embodiment of the present invention.

In FIG. 3, only three adjacent light-emitting units, a light-emitting unit Qn−1, a light-emitting unit Qn and a light-emitting unit Qn+1 (n: integer not less than two) are depicted in light-emitting units Q1–QN which constitutes the surface light-emitting device.

An arrangement and a function of the light-emitting unit Qn will be described as a representative of the plurality of light-emitting units Q1–QN. The light-emitting unit Qn comprises a LD bar 60 and a cooling assembly 10 for cooling the LD bar 60 mounted thereon. A cooling assembly having a conventional structure may be adopted as the cooling assembly 10 as shown in an exploded view of FIG. 4. Particularly, the cooling assembly 10 comprises three metal plates 11–13 joined together, which have openings 16 and 17 formed at corresponding positions to from passages for supplying/discharging the coolant. The coolant supplied from the openings 16 flows through coolant paths 15 formed by grooves and through holes in the metal plates 11–13 and discharged from the openings 17.

The LD bar 60 is mounted on an electrically conductive die spacer 41 fixed on the metal plate 13 by soldering in the vicinity of a peripheral side thereof, so that one electrode (e.g., positive electrode) of the LD bar 60 is electrically connected to the die spacer 41. A solder layer 42 is formed between the metal plate 13 and the die spacer 41, and a solder layer 43 is formed between the die spacer 41 and the LD bar 60 by the soldering.

A TAB sheet 20 formed from a TAB tape is used for electrically connecting the other electrode (e.g., negative electrode) of the LD bar 60 with the metal plate 11 of the adjacent light-emitting unit Qn+1. The TAB sheet 20 may have the same structure in the first embodiment. Particularly, the TAB sheet 20 comprises a copper plate 21 and a polyimide resin layer 28 covering a part of the copper plate 21, and has openings 26 and 27 respectively corresponding to the openings 16 and 17 formed in the cooling assembly 10. The TAB sheet 20 has a reduced-width portion in the vicinity of one end thereof where several slits 24 and 25 are formed.

A terminal portion of an extending section 22 of the copper plate 21 not coated with the polyimide resin layer 28 in the reduced-width portion of the TAB sheet 20 is used as a connecting portion 23 for bonding with the other electrode of the LD bar 60. It is preferable that a part or the whole of the copper plate 21 including the connecting portion 23 is coated by tin-lead solder. The connecting portion 23 may be further coated by gold in addition to the tin-lead solder so as to secure higher electrical conductivity.

In this second embodiment, a spacer plate 32 is intervened between the copper layer of the TAB sheet 20 and the metal plate 11 of the cooling assembly 10 of the adjacent cooling assembly Qn+1. The spacer plate 32 is arranged for adjusting a distance between the cooling assembly 10 of the light-emitting unit Qn and the cooling assembly 10 of the adjacent light-emitting unit Qn+1 so that the connecting portion 23 of the TAB sheet 20 is not in contact with the cooling assembly 10 of the adjacent light-emitting unit Qn+1 when the light-emitting units P1–PN are stacked. The spacer plate 32 may be omitted if it is not necessary to adjust the distance between the cooling assemblies 10.

In this embodiment, the polyimide resin layer 28 of the TAB sheet 20 is confronting and in contact with the cooling assembly 10 of the light-emitting unit Qn without any member intervened therebetween in both cases of using and not using the spacer plate 32. The copper plate 21 of the TAB sheet 20 is electrically isolated from the cooling assembly 10 of the light-emitting unit Qn by the polyimide layer 28 by high insulating characteristic of polyimide resin. Thus, the insulating sheet 51 used in the conventional structure as shown in FIG. 5 is made unnecessary.

The spacer plate 32 is required to have a function of securing the electrical conductivity between the copper plate 21 and the cooling assembly 10 of the adjacent light-emitting unit Qn+1. For this purpose, the spacer plate 32 is made of an electrically conductive material or an insulating material coated with an electrically conductive material. Typical electrical conductive materials are copper and an alloy of copper and tungsten. For securing the electrical conductivity, surfaces of the spacer plate 32, particularly, surfaces in contact with the adjacent cooling assembly 10 and the TAB sheet 20, respectively, may be coated by solder.

Further, an electrically conductive film or an electrically conductive double-coated adhesive tape which presents adhesion by heat may be used as the spacer plate 32.

In this embodiment also, a part of the cooling assembly 10 of each light-emitting unit serves as one electrode (e.g., a positive electrode) of the light-emitting unit, and the copper plate 21 of the TAB sheet 20 serves as the other electrode (e.g., a negative electrode to be connected to the ground) of the light-emitting unit. The plurality of light-emitting units Q1–QN are successively stacked and the LD bars 60 of the light-emitting units Q1–QN are electrically connected in series so that driving current flows in the LD bars 60 in series.

One terminal (e.g., positive terminal) of a power source is connected to the cooling assembly 10 of the light-emitting unit P1 at one end of the light-emitting device and the other terminal (e.g., negative terminal) of the power source is connected to the copper plate 21 of the light-emitting device PN at the other end of the light-emitting device.

Openings respectively corresponding to the openings 16 and 17 formed in the metal plates 11–13 of the cooling assembly 10 are formed in the spacer plate 32, so that the passages of the coolant are formed through the stacked light-emitting units Q1–QN. One end or both ends of each passage is connected to an inlet or an outlet of a circular pump of coolant.

In the above first and second embodiments, it is advantageous to coat a part or the whole of outer surfaces of the cooling assembly 10 with gold or solder in obtaining stable bonding. Sn and an alloy of Pb and Sn may be used as material of solder, and it is preferable to use material having a high composition ratio of Sn or Pb and thus a high melting point as the soldering material so that the solder does not melt in bonding of the LD bar 60. The soldering material of Pb—Sn containing Sn at a composition ratio of 80% is generally used at low cost.

According to the present invention, the insulating sheet, the conductive sheet and the bonding wire used for the electrical connection with the LD bar in the conventional structure are replaced with the TAB sheet formed from the TAB tape which is a mass-produced product available in low cost, to reduce the cost of the parts and cost of assembly of the surface light-emitting device.

Further, in comparison with the wire bonding, the TAB sheet has a large sectional area of the conductive part and the electrode of the LD bar and the cooling assembly is electrically connected by an integral conductive element of the conductive layer of the TAB sheet without connection board used in the conventional structure, to reduce electrical resistance in the electrical connection. Thus, an efficiency of energy conversion from electricity to light is enhanced to enable reduction of the driving voltage.

The restriction of thickness of the TAB tape is coped with a spacer plate for adjusting the space between the adjacent cooling assemblies to utilizing the merit of mas-production of the TAB tape. Gold or solder coating is provided on necessary portion of the elements to secure stable bonding and electrical conductivity between the elements.

The stress possibly caused by the web-like conductive layer of the TAB sheet is eliminated by the slits formed in the electrically connecting portion of the conductive layer. Further, the guide and the holes for pins make the stacking of the light-emitting unit easy.

What is claimed is:

1. A two-dimensional light-emitting device comprising:
   a plurality of stacked light-emitting units, each of said light-emitting units comprises:
   a cooling assembly,
   a laser diode bar arranged on the cooling assembly to be thermally and electrically connected with the laser diode bar, at least a part of said cooling assembly serving as a first electrode of each light-emitting unit, and
   a tape-automated-bonding sheet including an electrically conductive layer and an insulating layer and arranged between adjacent ones of the cooling assemblies such that said insulating layer confronts a surface of the cooling assembly on which the laser diode bar is arranged, said electrically conductive layer including a webbed extending section to electrically connection with the laser diode bar and serving as a second electrode of each said light-emitting unit, the webbed extending section having slits formed therein to prevent stress on the laser diode bar, wherein said first electrode and said second electrode of each said light-emitting unit are electrically isolated from each other by said insulating layer.

2. A two-dimensional light-emitting device according to claim 1, wherein each cooling assembly has first openings to form passages to introduce and discharge coolant and coolant paths communicating with the passages, and each tape-automated-bonding sheet has second openings corresponding to said first openings formed in the respective cooling assemblies.

3. A two-dimensional light-emitting device according to claim 1, wherein each of said light-emitting units further comprises a spacer plate arranged between the adjacent ones of the cooling assemblies to adjust a space between the adjacent ones of the cooling assemblies.

4. A two-dimensional light-emitting device according to claim 3, wherein each said spacer plate is arranged between the tape-automated-bonding sheet and the surface of the cooling assembly of a respective light-emitting unit.

5. A two-dimensional light-emitting device according to claim 4, wherein each said spacer plate comprises a member which presents adhesion by heat.

6. A two-dimensional light-emitting device according to claim 3, wherein each said spacer plates is arranged between the tape-automated-bonding sheet of a respective light-emitting unit and the cooling assembly of an adjacent light-emitting unit adjacent to the respective light-emitting unit.

7. A two-dimensional light-emitting device according to claim 6, wherein each said spacer plate is made of an electrically conductive material.

8. A two-dimensional light-emitting device according to claim 7, wherein each said spacer plate is made of copper.

9. A two-dimensional light-emitting device according to claim 7, wherein each of said light-emitting units further comprises a spacer arranged between the laser diode bar of the respective light-emitting unit and the cooling assembly of an adjacent light-emitting unit, and made of an alloy containing copper and tungsten.

10. A two-dimensional light-emitting device according to claim 6, wherein each said spacer plate comprises a member made of an insulating material coated by an electrically conductive material.

11. A two-dimensional light-emitting device according to claim 6, wherein at least a surface of each said spacer plate confronting the tape-automated-bonding sheet of the respective light-emitting unit and a surface of said spacer plate confronting the cooling assembly of the adjacent light-emitting unit adjacent to the respective light-emitting unit are coated by solder.

12. A two-dimensional light-emitting device according to claim 1, wherein each said tape-automated-bonding sheet further includes a metal plate arranged on a respective electrically conductive layer.

13. A two-dimensional light-emitting device according to claim 12, wherein each said metal plate is a copper plate.

14. A two-dimensional light-emitting device according to claim 13, wherein each said cop per plate is coated with solder.

15. A two-dimensional light-emitting device according to claim 1, wherein each said tape-automated-bonding sheet further includes an insulant plate having a respective electrically conductive layer formed thereon and arranged on the respective electrically conductive layer.

16. A two-dimensional light-emitting device according to claim 1, wherein a connecting portion of said webbed extending section of a respective tape-automated-bonding sheet to be electrically connected with a respective laser diode bar is coated by solder or gold.

17. A two-dimensional light-emitting device according to claim 1, wherein slits are formed in a vicinity of a connecting portion of said webbed extending section of each said tape-automated-bonding sheet to be electrically connected with a respective laser diode bar.

18. A two-dimensional light-emitting device according to claim 1, wherein outer surfaces of the cooling assemblies are coated by gold.

19. A two-dimensional light-emitting device according to claim 1, wherein each of said light-emitting units further comprises a die spacer intervened between respective ones of the laser diode bar and of the cooling assembly.

20. A two-dimensional light-emitting device according to claim 19, wherein each said die spacer is made of a material having a coefficient of thermal expansion approximate to a coefficient of thermal expansion of the respective laser diode bar and a high heat conductivity.

21. A two-dimensional light-emitting device comprising:
a plurality of stacked light-emitting units, each comprising:
    a cooling assembly,
    a laser diode bar arranged on a respective cooling assembly such that each said laser diode bar is thermally and electrically connected therewith, at least a part of each said cooling assembly serving as a first electrode of a respective one of the light-emitting units, and
    a tape-automated-bonding sheet comprising:
        an electrically conductive layer, and
        an insulating layer, a respective tape-automated-bonding sheet being arranged between adjacent ones of the cooling assemblies such that a respective insulating layer confronts a surface of the respective cooling assembly on which the laser diode bar is arranged, each said electrically conductive layer including a webbed extending section to electrically connect with a respective laser diode bar and serving as a second electrode of the respective one of the light-emitting units, each said webbed extending section having slits formed therein to prevent stress on the respective laser diode bar, wherein said first electrode and said second electrode of the respective one of the light-emitting units are electrically isolated from each other by a respective insulating layer.

22. A two-dimensional light-emitting device comprising:
a plurality of stacked light-emitting units, each comprising:
    a cooling assembly;
    a tape-automated-bonding sheet comprising:
        an electrically conductive layer, and
        an insulating layer, a respective tape-automated-bonding sheet being arranged between adjacent ones of the cooling assemblies, each said electrically conductive layer including a webbed extending section; and
    a laser diode bar electrically connecting with an electrically conductive layer of a respective tape-automated-bonding sheet, each said webbed extending section having slits formed therein to prevent stress in a respective laser diode bar.

23. A two-dimensional light-emitting device comprising:
a plurality of stacked light-emitting units, each comprising:
    a cooling assembly having first openings to form passages to introduce and discharge coolant and coolant paths communicating with the passages;
    a tape-automated-bonding sheet having second openings corresponding to the first openings formed in the cooling assembly and comprising:
        an electrically conductive layer, and
        an insulating layer, a respective tape-automated-bonding sheet being arranged between adjacent ones of the cooling assemblies, each said electrically conductive layer including a webbed extending section; and
    a laser diode bar electrically connecting with an electrically conductive layer of a respective tape-automated-bonding sheet, each said webbed extending section having slits formed therein to prevent stress in a respective laser diode bar.

* * * * *

UNITED STATES PATENT AND TRADEMARK OFFICE
CERTIFICATE OF CORRECTION

PATENT NO. : 6,934,309 B2  Page 1 of 1
APPLICATION NO. : 10/216324
DATED : August 23, 2005
INVENTOR(S) : Yuji Nishikawa et al.

It is certified that error appears in the above-identified patent and that said Letters Patent is hereby corrected as shown below:

Column 6, line 67, change "ployimide" to - - polyimide - - .

Column 9, line 41, change "mas-production" to - - mass-production - - .

Column 9, line 67, change "connection" to - - connect - -.

Column 10, line 61, change "cop per" to - - copper - -.

Signed and Sealed this

Fifteenth Day of August, 2006

JON W. DUDAS
*Director of the United States Patent and Trademark Office*